United States Patent
Yokoyama

(10) Patent No.: US 9,160,298 B2
(45) Date of Patent: Oct. 13, 2015

(54) ACOUSTIC WAVE DEVICE

(75) Inventor: Tsuyoshi Yokoyama, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 338 days.

(21) Appl. No.: 13/559,151

(22) Filed: Jul. 26, 2012

(65) Prior Publication Data

US 2013/0049544 A1 Feb. 28, 2013

(30) Foreign Application Priority Data

Aug. 22, 2011 (JP) .................. 2011-180819

(51) Int. Cl.
*H01L 41/187* (2006.01)
*H03H 9/02* (2006.01)
*H03H 9/17* (2006.01)

(52) U.S. Cl.
CPC ......... *H03H 9/02015* (2013.01); *H01L 41/187* (2013.01); *H03H 9/173* (2013.01)

(58) Field of Classification Search
CPC ............................. H01L 41/18; H01L 41/187
USPC ............... 310/320, 358; 252/62.9 R, 62.9 PZ
See application file for complete search history.

(56) References Cited

U.S. PATENT DOCUMENTS

| 8,362,675 B2 * | 1/2013 | Chen et al. ................ 310/346 |
| 2004/0135144 A1 | 7/2004 | Yamada et al. |
| 2005/0264137 A1 | 12/2005 | Taniguchi et al. |
| 2007/0080611 A1 | 4/2007 | Yamada et al. |
| 2007/0159026 A1 * | 7/2007 | Kando .................. 310/313 D |
| 2008/0129417 A1 | 6/2008 | Taniguchi et al. |
| 2008/0284543 A1 | 11/2008 | Taniguchi et al. |

FOREIGN PATENT DOCUMENTS

| CN | 1716768 A | 1/2006 |
| CN | 101280412 A | 10/2008 |
| JP | 2002-344279 A | 11/2002 |
| JP | 2003-051732 A | 2/2003 |
| JP | 2003-198319 A | 7/2003 |
| JP | 2007-110281 A | 4/2007 |
| JP | 2008-103798 A | 5/2008 |
| JP | 2009-10926 A | 1/2009 |
| JP | 2009-252789 A | 10/2009 |
| KR | 10-2003-0090790 A | 11/2003 |

OTHER PUBLICATIONS

Korean Office Action dated Sep. 23, 2013, in a counterpart Korean patent application No. 10-2012-0078110.
Naik et al., "Measurements of the Bulk, C-Axis Electromechanical Coupling Constant as a Function of AlN Film Quality", IEEE Transactions on Ultrasonics, Ferroelectrics, and Frequency Control, Jan. 2000, vol. 47, No. 1, p. 292-296.

(Continued)

*Primary Examiner* — Derek Rosenau
(74) *Attorney, Agent, or Firm* — Chen Yoshimura LLP

(57) ABSTRACT

An acoustic wave device includes: a substrate; a lower electrode that is located on the substrate; a piezoelectric film that is located on the lower electrode and made of aluminum nitride of which a ratio of a lattice constant in a c-axis direction to a lattice constant in an a-axis direction is smaller than 1.6; and an upper electrode that is located on the piezoelectric film and faces the lower electrode across the piezoelectric film.

6 Claims, 9 Drawing Sheets

(56) References Cited

OTHER PUBLICATIONS

Chinese Office Action dated Sep. 22, 2014, in a counterpart Chinese patent application No. 201210298819.1.

Chinese Office Action dated Feb. 25, 2015, in a counterpart Chinese patent application No. 201210298819.1.

Japanese Office Action dated May 26, 2015, in a counterpart Japanese patent application No. 2011-180819.

* cited by examiner

ACOUSTIC WAVE DEVICE

CROSS-REFERENCE TO RELATED APPLICATION

This application is based upon and claims the benefit of priority of the prior Japanese Patent Application No. 2011-180819, filed on Aug. 22, 2011, the entire contents of which are incorporated herein by reference.

FIELD

A certain aspect of the present invention relates to an acoustic wave device.

BACKGROUND

In recent years, communication devices such as mobile phones become widely used. There is a case where acoustic wave devices using an acoustic wave are used as filters of communication devices, duplexers and the like. As examples of acoustic wave devices, there are devices using Surface Acoustic Wave (SAW), devices using Bulk Acoustic Wave (BAW) and the like. Piezoelectric thin film resonators are devices which use BAW, and include an FBAR (Film Bulk Acoustic Resonator), an SMR (Solidly Mounted Resonator) and the like. In addition, there are devices using a Lamb Wave. When the electromechanical coupling factor of the piezoelectric film becomes large, frequency characteristics of the acoustic wave device are improved, and the bandwidth widening becomes possible.

Japanese Patent Application Publication No. 2002-344279 discloses a technique that improves characteristics of a piezoelectric thin film resonator by using the piezoelectric thin film including an alkali earth metal and a rare-earth metal. Japanese Patent Application Publication No. 2009-10926 discloses a technique that improves characteristics of the piezoelectric thin film resonator by using a piezoelectric thin film including scandium. IEEE TRANSACTIONS ON ULTRASONICS, FERROELECTRICS AND FREQUENCY CONTROL, vol.47, p.292, 2000 discloses a technique that increases the electromechanical coupling factor of the piezoelectric thin film resonator by controlling the orientation of the piezoelectric thin film made of aluminum nitride (AlN).

However, there may be a case that it is difficult to obtain the high-enough electromechanical coupling by conventional techniques.

SUMMARY OF THE INVENTION

According to an aspect of the present invention, there is provided an acoustic wave device including: a substrate; a lower electrode that is located on the substrate; a piezoelectric film that is located on the lower electrode and made of aluminum nitride of which a ratio of a lattice constant in a c-axis direction to a lattice constant in an a-axis direction is smaller than 1.6; and an upper electrode that is located on the piezoelectric film and faces the lower electrode across the piezoelectric film.

According to another aspect of the present invention, there is provided another acoustic wave device including: a substrate; a lower electrode that is located on the substrate; a piezoelectric film that is located on the lower electrode and made of aluminum nitride of which a lattice constant in a c-axis direction is smaller than 0.498 nm; and an upper electrode that is located on the piezoelectric film and faces the lower electrode across the piezoelectric film.

BRIEF DESCRIPTION OF THE DRAWINGS

FIG. 3 is a graph illustrating a relation between a residual stress and a rate of change in a ratio of lattice constants c/a;

DETAILED DESCRIPTION

Figure 1A:
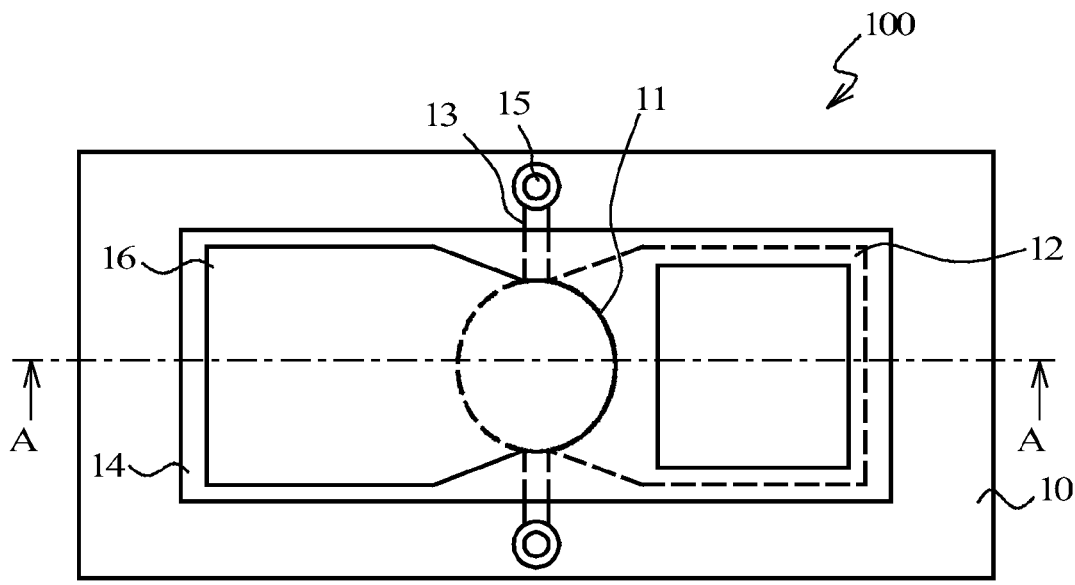
FIG. 1A is a plain view illustrating an FBAR.

Hereinafter, descriptions will be given of an FBAR as an example of an acoustic wave device. A description will now be given of a structure of an FBAR. FIG. 1A is a plain view illustrating an FBAR, and FIG. 1B is a cross-sectional view illustrating the FBAR and illustrates a cross section taken along line A-A of FIG. 1A.

Figure 1B:
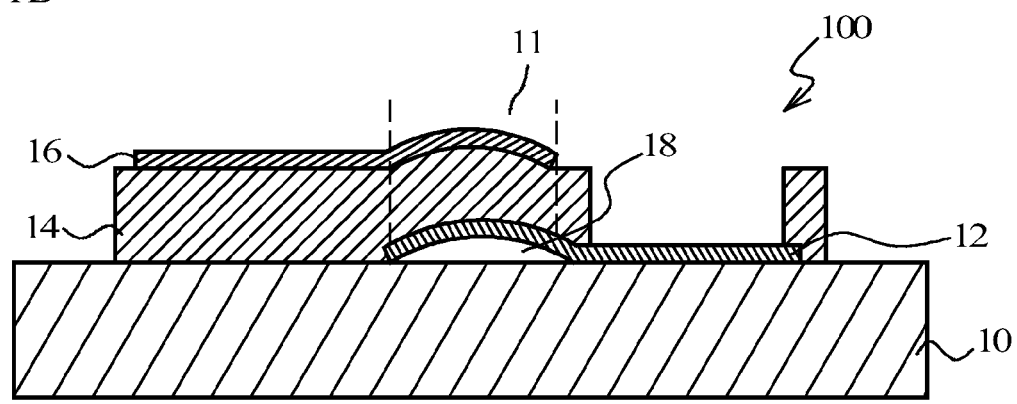
FIG. 1B is a cross-sectional view illustrating the FBAR.

As illustrated in FIG. 1A and FIG. 1B, an FBAR 100 includes a substrate 10, a lower electrode 12, a piezoelectric thin film 14, and an upper electrode 16. The lower electrode 12 is located on the substrate 10. A dome-shaped space 18 is formed between the substrate 10 and the lower electrode 12. In other words, a distance between the substrate 10 and the lower electrode 12 is large in the center area of the space 18, and a distance between the substrate 10 and the lower electrode 12 is small in the periphery area of the space 18. The lower electrode 12 is exposed to the space 18. The piezoelectric thin film 14 is located on the lower electrode 12. The upper electrode 16 is located on the piezoelectric thin film 14. In other words, the lower electrode 12 and the upper electrode 16 sandwiches the piezoelectric thin film 14 therebetween. The lower electrode 12, the piezoelectric thin film 14 and the upper electrode 16 overlap, and a resonance region 11 is formed. An acoustic wave excited in the resonance region 11 oscillates in the thickness direction (the longitudinal direction of FIG. 1B), and propagates in the surface direction (the lateral direction of FIG. 1B). A part of the lower electrode 12 exposed from the aperture of the piezoelectric thin film 14 functions as a terminal portion for extracting an electrical signal. An introduction path 13 which is connected to the space 18 is provided to the lower electrode 12. A hole portion 15 is formed at the end of the introduction path 13. The introduction path 13 and the hole portion 15 are used in a process for forming the space 18.

The substrate 10 is made of an insulating material such as silicon (Si), glass, gallium arsenide (GaAs) and the like. The lower electrode 12 has a two-layer structure of ruthenium/chrome (Ru/Cr), and the upper electrode 16 has a two-layer structure of Cr/Ru. In other words, each of the lower electrode 12 and the upper electrode 16 is made by stacking a Cr layer and an Ru layer in this order from the side closer to the piezoelectric thin film 14. The Cr layer of the lower electrode 12 has a thickness of 100 nm for example, and the Ru layer has a thickness of 250 nm for example. The Cr layer of the upper electrode 16 has a thickness of 20 nm for example, and the Ru layer has a thickness of 250 nm. The piezoelectric thin film 14 is made of aluminum nitride (AlN) having a main axis of (002) direction. In other words, the piezoelectric thin film 14 has an orientation in which the c-axis is directed in the thickness direction and the a-axis is directed in the surface direction.

As the electromechanical coupling factor $k_{33}^2$ of the piezoelectric thin film 14 becomes higher, characteristics of the FBAR 100 are improved. The crystal structure of AlN composing the piezoelectric thin film 14 affects the electromechanical coupling factor $k_{33}^2$. A simulation and an experiment are performed to examine the relation between the crystal structure and the electromechanical coupling factor $k_{33}^2$.

In the simulation, the first principle calculation of the electronic state including a structure optimization of AlN is carried out by using the pseudopotential method as the calculation technique and using ABINIT as a program for calculation. The lattice constant c in the c-axis direction, and a ratio of the lattice constant c to a lattice constant a in the a-axis direction (a ratio of lattice constants) c/a can be obtained by the calculation of the electronic state of AlN in a stable structure. In addition, a piezoelectric constant $e_{33}$, an elastic constant $C_{33}$ and a permittivity $\epsilon_{33}$ in the c-axis direction can be obtained by adding strain to the crystal lattice of AlN in a stable structure. In other words, the piezoelectric constant $e_{33}$, the elastic constant $C_{33}$ and the permittivity $\epsilon_{33}$ in a case where the lattice constant c and c/a change can be obtained. A relation between the electromechanical coupling factor $k_{33}^2$ and the piezoelectric constant $e_{33}$, the elastic constant $C_{33}$ and the permittivity $\epsilon_{33}$ is expressed with a following formula.

$$k_{33}^2 = \frac{e_{33}^2}{\epsilon_{33} \times C_{33}} \quad \text{[Formula 1]}$$

Based on Formula 1, the change of the electromechanical coupling factor $k_{33}^2$ in a case where the lattice constant c and c/a change can be obtained. According to the JCPDS (Joint Committee on Powder Diffraction Standards) card chart, in a case where there is no strain on the crystal lattice, the lattice constant c is 0.498 nm, and the ratio of lattice constants c/a is 1.6. That is to say, the bulk value of the lattice constant c is 0.498 nm, and the bulk value of the ratio of lattice constants c/a is 1.6.

Figure 2A:
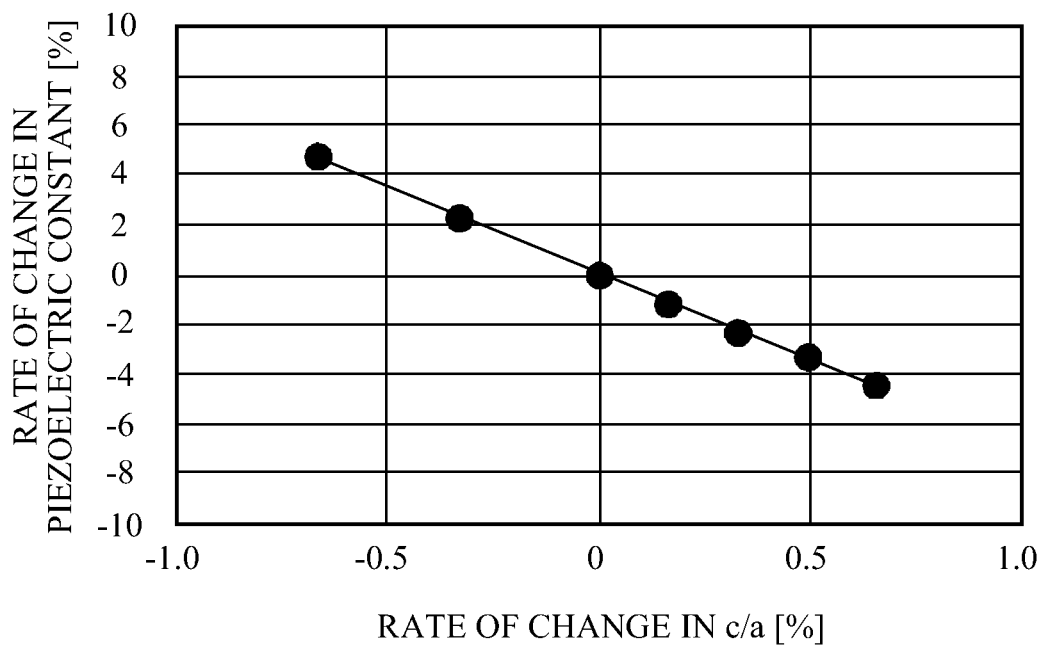
FIG. 2A is a graph illustrating a relation between a rate of change in a ratio of lattice constants c/a and a rate of change in a piezoelectric constant.

FIG. 2A is a graph illustrating a relation between the rate of change in the ratio of lattice constants c/a and the rate of change in the piezoelectric constant. A horizontal axis represents the rate of change in the ratio of lattice constants c/a, and a vertical axis represents the rate of change in the piezoelectric constant $e_{33}$. The rate of change in the ratio of lattice constants c/a is a rate of change based on the bulk value 1.6. The rate of change in the piezoelectric constant $e_{33}$ is a rate of change based on the piezoelectric constant $e_{33}$ in a case where the strain is not added to the crystal lattice. As illustrated in FIG. 2A, when the rate of change in c/a is negative, the rate of change in the piezoelectric constant $e_{33}$ becomes positive. When the rate of change in c/a is positive, the rate of change in the piezoelectric constant $e_{33}$ becomes negative. In other words, as c/a becomes smaller than its bulk value 1.6, the piezoelectric constant $e_{33}$ becomes large. As is clear from the above Formula 1, as the piezoelectric constant $e_{33}$ becomes large, the electromechanical coupling factor $k_{33}^2$ also becomes large. The rate of change in c/a becomes negative, when the lattice constant c becomes larger than its bulk value 0.498 nm, for example.

Figure 2B:
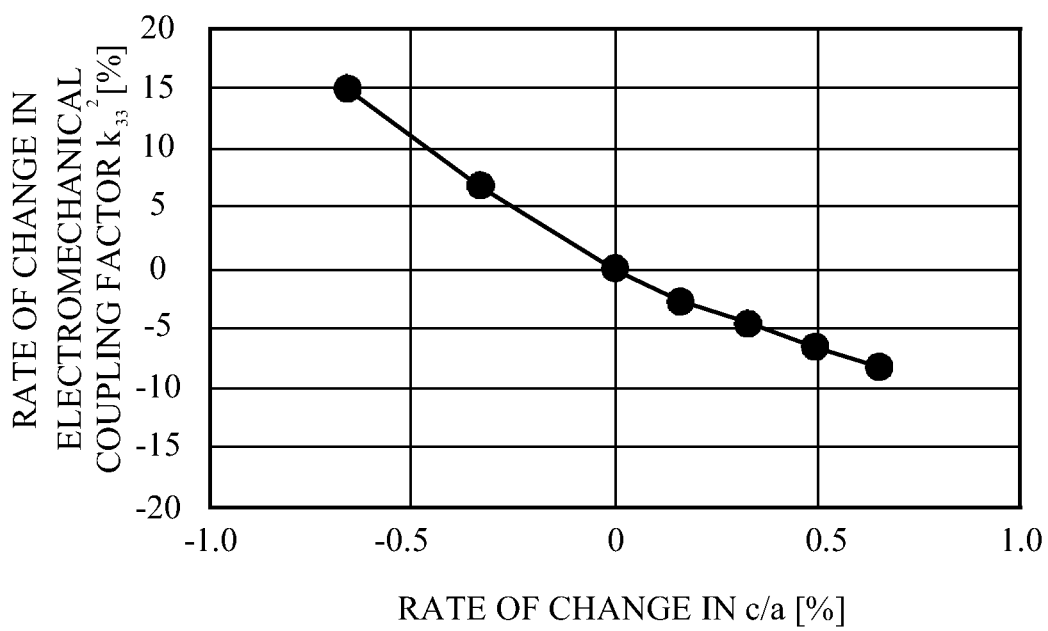
FIG. 2B is a graph illustrating a relation between a rate of change in a ratio of lattice constants c/a and a rate of change in an electromechanical coupling factor.

FIG. 2B is a graph illustrating a relation between the rate of change in the ratio of lattice constants c/a and the rate of change in the electromechanical coupling factor. A horizontal axis represents the rate of change in the ratio of lattice constants c/a, and a vertical axis represents the rate of change in the electromechanical coupling factor $k_{33}^2$. The rate of change in the electromechanical coupling factor $k_{33}^2$ is a rate of change based on the electromechanical coupling factor $k_{33}^2$ in a case where the strain is not added to the crystal lattice. As illustrated in FIG. 2B, when the rate of change in c/a is negative, the rate of change in the electromechanical coupling factor $k_{33}^2$ becomes positive. When the rate of change in c/a is positive, the rate of change in the electromechanical coupling factor $k_{33}^2$ becomes negative. In other words, as c/a becomes smaller than its bulk value 1.6, the electromechanical coupling factor $k_{33}^2$ becomes large.

Figure 3:
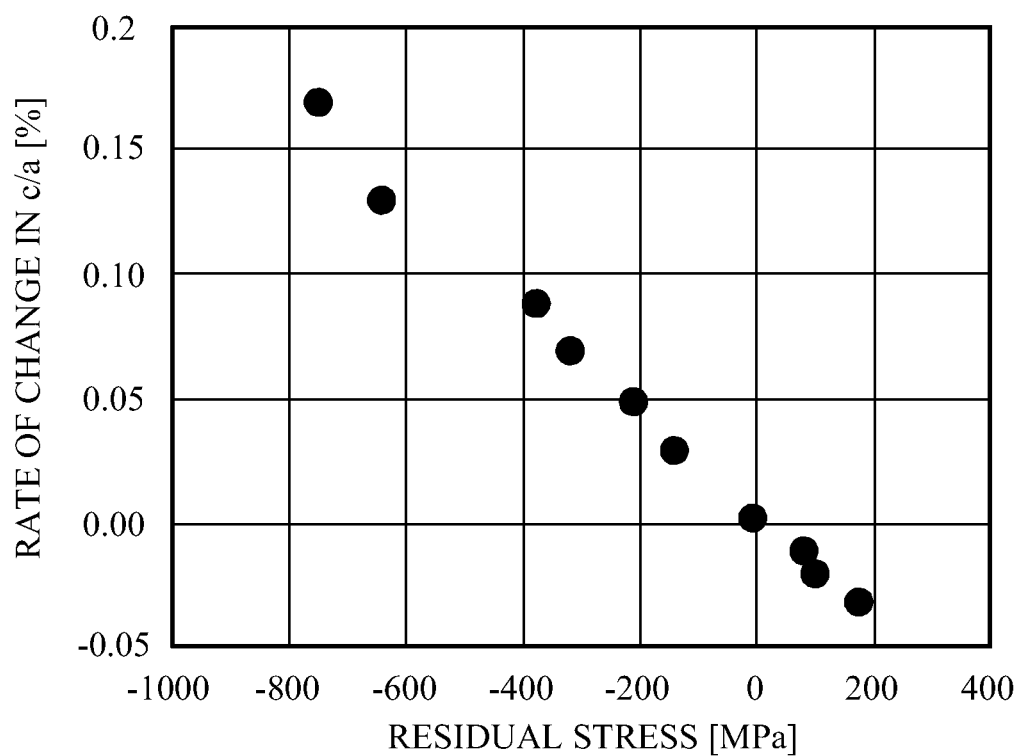

A description will now be given of a method to reduce the lattice constant c and the ratio of lattice constants c/a. A description will be given of the experiment in which a relation between the residual stress and the lattice constant is examined. In samples in which the film forming conditions of the piezoelectric thin film 14 are changed, the residual stress and the ratio of lattice constants c/a are measured. The piezoelectric thin film 14 is made of AlN having a thickness of 1200 nm. FIG. 3 is a graph illustrating a relation between the residual stress and the rate of change in the ratio of lattice constants c/a. A horizontal axis represents the residual stress that remains in the piezoelectric thin film 14, and a vertical axis represents the rate of change in the ratio of lattice constants c/a. When the residual stress is a tensile stress, the residual stress takes a positive value. When the residual stress is a compression stress, the residual stress takes a negative value. The compression stress is a stress in a direction narrowing the upper surface of the piezoelectric thin film 14 in FIG. 1B. The tensile stress is a stress in a direction stretching the upper surface of the piezoelectric thin film 14.

As illustrated in FIG. 3, when the residual stress is negative, c/a becomes large. When the residual stress is positive, c/a becomes small. In other words, when the residual stress is a tensile stress, the rate of change in c/a becomes negative, and c/a becomes smaller than its bulk value. As a result, as illustrated in FIG. 2A and FIG. 2B, it becomes possible to make the piezoelectric constant $e_{33}$ and the electromechanical coupling factor $k_{33}^2$ large.

A description will now be given of a simulation in which a relation between the composition of the piezoelectric thin film 14 and the lattice constant is examined. An example in which AlN composing the piezoelectric thin film 14 is doped with a ternary element other than Al and N, and a part of Al sites is replaced with the ternary element is considered. AlN doped with the ternary element is referred to as a doped AlN, and AlN which is not doped with the ternary element is referred to as a non-doped AlN. By the execution of the first principle calculation of the electronic state of the doped AlN, a stable structure of the doped AlN can be obtained. In other words, the ratio of lattice constants c/a in the doped AlN can be obtained. In addition, by the addition of strain to the crystal lattice of the doped AlN in a stable structure, the piezoelectric constant $e_{33}$, the elastic constant $C_{33}$ and the permittivity $\epsilon_{33}$ can be obtained. The ternary element content of the doped AlN is set to 12.5 atomic %.

Figure 4:
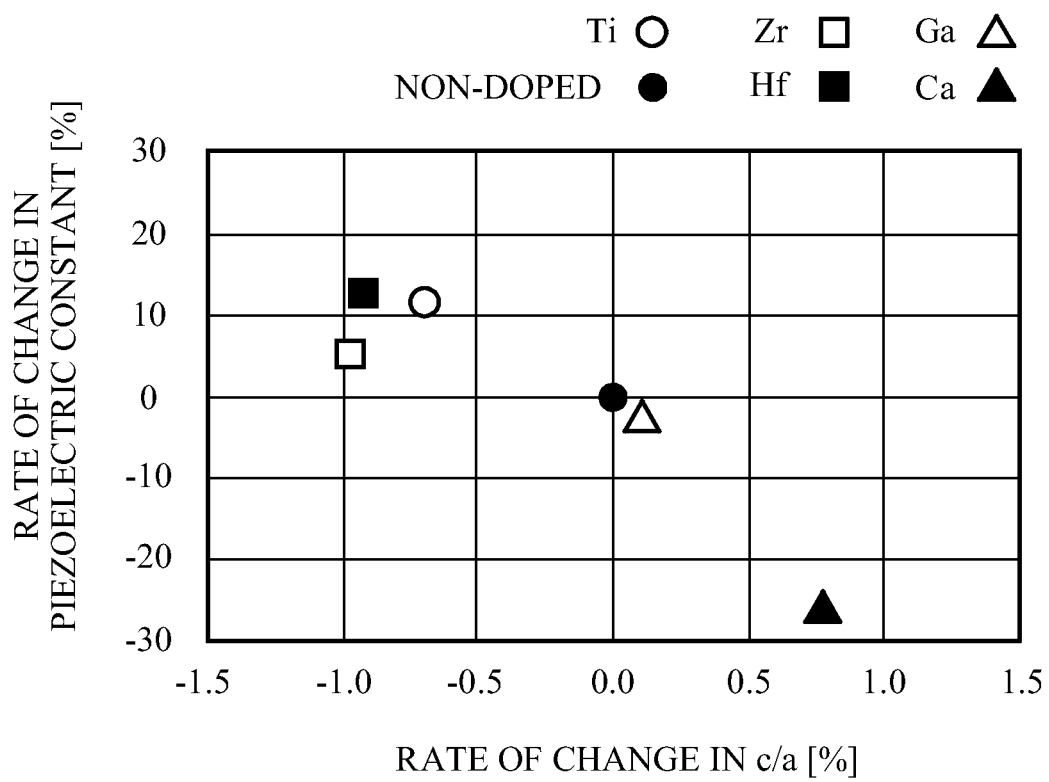
FIG. 4 is a graph illustrating a relation between a rate of change in a ratio of lattice constants c/a and a rate of change in a piezoelectric constant in a case where a composition of a piezoelectric thin film is changed.

FIG. 4 is a graph illustrating a relation between the rate of change in the ratio of lattice constants c/a and the rate of change in the piezoelectric constant in a case where the composition of the piezoelectric thin film is changed. A horizontal axis represents the rate of change in the ratio of lattice constants c/a, and a vertical axis represents the rate of change in the piezoelectric constant $e_{33}$. The rate of change in the ratio of lattice constants c/a is a rate of change based on c/a in the non-doped AlN. The rate of change in the piezoelectric constant $e_{33}$ is a rate of change based on $e_{33}$ in the non-doped AlN. The black circle represents an example in which the piezoelectric thin film 14 is made of non-doped AlN. The outlined square represents an example in which the piezoelectric thin film 14 is made of zirconium (Zr)-doped AlN. The black square represents an example in which the piezoelectric thin film 14 is made of hafnium (Hf)-doped AlN. The outlined circle represents an example in which the piezoelectric thin film 14 is made of titanium (Ti)-doped AlN. The outlined triangle represents an example in which the piezoelectric thin film 14 is made of gallium (Ga)-doped AlN. The black triangle represents an example in which the piezoelectric thin film 14 is made of calcium (Ca)-doped AlN.

Figure 5A:
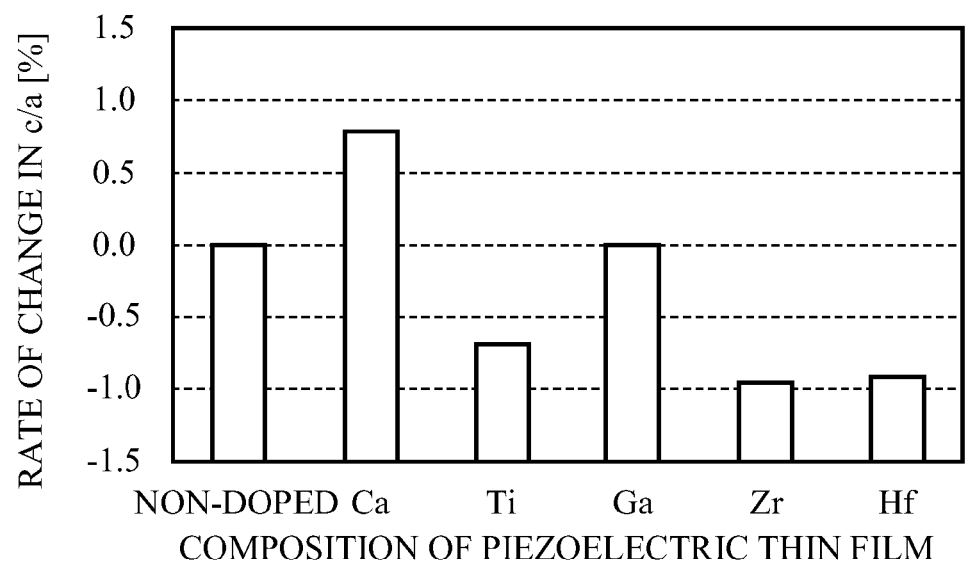
FIG. 5A is a graph illustrating a relation between the composition of the piezoelectric thin film and the rate of change in the ratio of lattice constants extracted from FIG. 4.
Figure 5B:
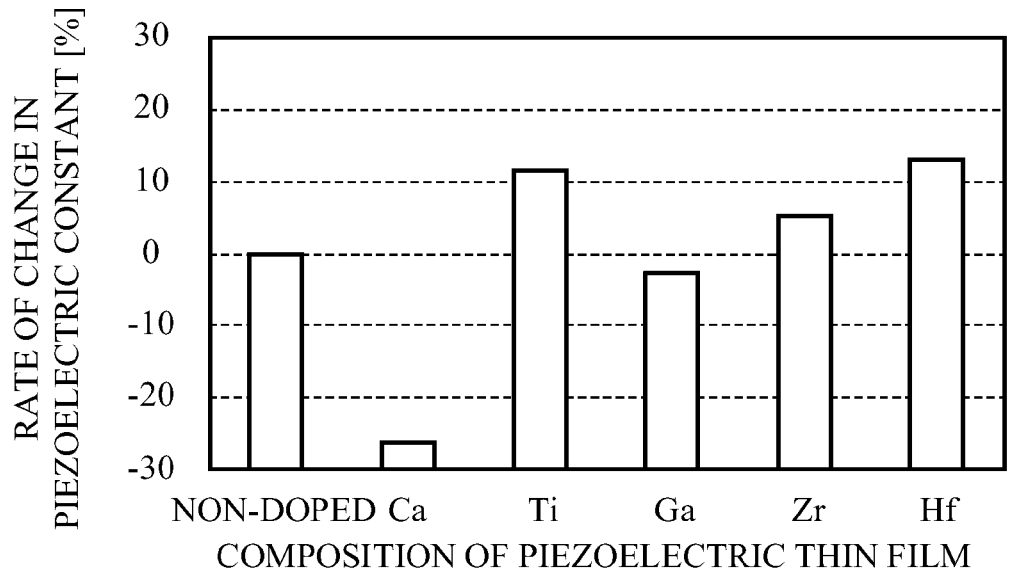
FIG. 5B is a graph illustrating a relation between the composition of the piezoelectric thin film and the rate of change in the piezoelectric constant extracted from FIG. 4.

FIG. 5A is a graph illustrating a relation between the composition of the piezoelectric thin film and the rate of change in the ratio of lattice constants extracted from FIG. 4. A horizontal axis represents the composition of the piezoelectric thin film 14. "Non-doped" in FIG. 5A means that the piezoelectric thin film 14 is made of non-doped AlN. The name of each element in FIG. 5A means that the piezoelectric thin film 14 is made of AlN doped with each element. A vertical axis represents the rate of change in the ratio of lattice constants c/a. FIG. 5B is a graph illustrating a relation between the composition of the piezoelectric thin film and the rate of change in the piezoelectric constant extracted from FIG. 4. A horizontal axis represents the composition of the piezoelectric thin film 14. A vertical axis represents the rate of change in the piezoelectric constant $e_{33}$.

As illustrated in FIG. 4 and FIG. 5A, when AlN is doped with Ga or Ca, the rate of change in c/a is positive. On the other hand, when AlN is doped with Zr, Hf or Ti, the rate of change in c/a is negative. As illustrated in FIG. 4 and FIG. 5B, when AlN is doped with Ga or Ca, the rate of change in the piezoelectric constant $e_{33}$ is negative. On the other hand, when AlN is doped with Zr, Hf or Ti, the rate of change in the piezoelectric constant $e_{33}$ is positive. Especially, when AlN is doped with Hf or Ti, the rate of change in the piezoelectric constant $e_{33}$ exceeds 10%. The piezoelectric constant $e_{33}$ becomes large and the electromechanical coupling factor $k_{33}^2$ also becomes large by using the doped AlN which is doped with Zr, Hf or Ti.

As described above, when the residual stress of the piezoelectric thin film 14 is a tensile stress, or when the piezoelectric thin film 14 is made of doped AlN, the ratio of lattice constants c/a becomes small, and the electromechanical coupling factor $k_{33}^2$ becomes large. A description will be given of embodiments based on the above knowledge.

First Embodiment

A first embodiment is an example in which a tensile stress remains in the piezoelectric thin film 14. A structure of an FBAR in accordance with the first embodiment is the same as the one illustrated in FIG. 1A and FIG. 1B. The piezoelectric thin film 14 (piezoelectric film) is made of non-doped (additive-free) AlN. "Non-doped" means that AlN is not doped with an element intentionally.

Figure 6A:
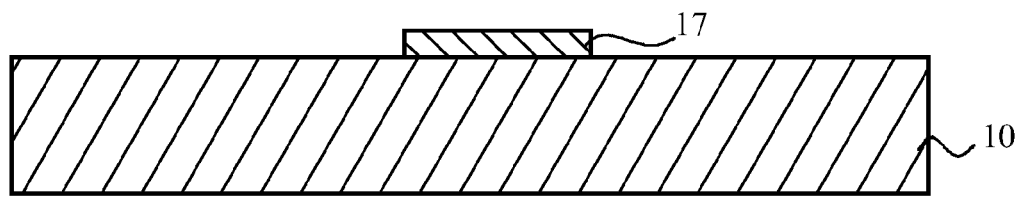
FIG. 6A through FIG. 6C are cross-sectional views illustrating a fabrication method of an FBAR in accordance with a first embodiment.
Figure 6B:
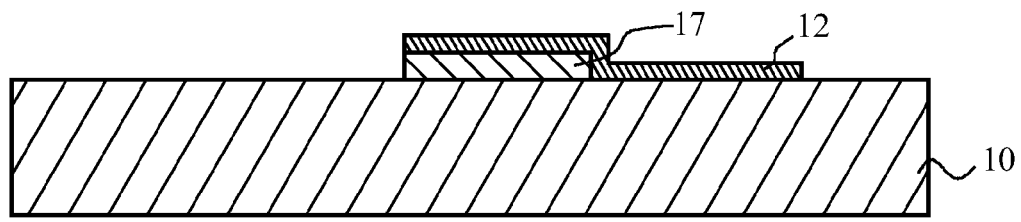
Figure 6C:
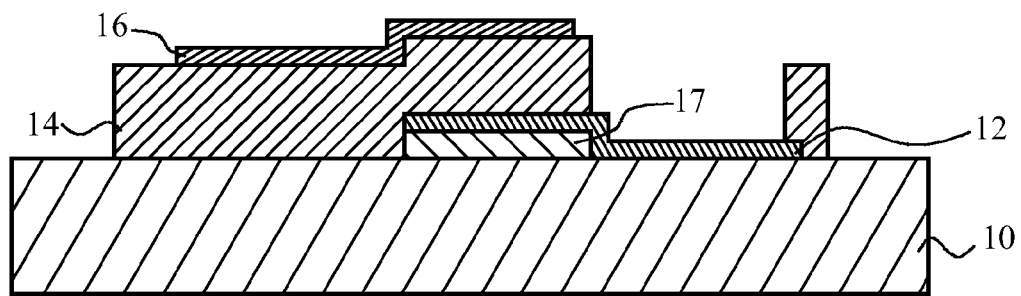

A description will now be given of a fabrication method of the FBAR in accordance with the first embodiment. FIG. 6A through FIG. 6C are cross-sectional views illustrating the fabrication method of the FBAR in accordance with the first embodiment.

As illustrated in FIG. 6A, a sacrifice layer 17 is formed on the substrate 10 by the sputtering method or the evaporation method for example. The sacrifice layer 17 is made of magnesium oxide (MgO) for example, and is located in a region in which the space 18 is formed. The sacrifice layer 17 has a thickness of 20 nm for example.

As illustrated in FIG. 6B, the lower electrode 12 is formed by the sputtering method for example. The sputtering method is performed under a pressure of 0.6 to 1.2 Pa and in an argon (Ar) gas atmosphere. The pressure and the atmosphere mean a pressure and an atmosphere in a sputtering device. After the film formation, the lower electrode 12 is shaped into a predetermined shape by the exposure technology, the etching technique and the like for example. As illustrated on the left side of FIG. 6B, one of end portions of the lower electrode 12 overlaps with one of end portions of the sacrifice layer 17. On the other hand, as illustrated on the right side of FIG. 6B, another end portion of the lower electrode 12 extends to the upper surface of the substrate 10.

As illustrated in FIG. 6C, the piezoelectric thin film 14 is formed by the sputtering method for example. The piezoelectric thin film 14 is made of AlN having a film thickness of 400 nm for example and having the c-axis as a main axis. The sputtering method is performed under a pressure of about 0.3 Pa and in an argon/nitrogen (Ar/N$_2$) mixed gas atmosphere. The stress of the piezoelectric thin film 14 becomes a tensile stress by increasing the flow ratio of Ar in the Ar/N$_2$ mixed gas, and the stress of the piezoelectric thin film 14 becomes a compression stress by decreasing the flow ratio of Ar. In the first embodiment, the stress of the piezoelectric thin film 14 is made to be a tensile stress by increasing the flow ratio of Ar to 0.25 which is calculated by Ar flow rate/(Ar flow rate+N$_2$ flow rate). The flow ratio of Ar may be changed in accordance with the device.

The upper electrode 16 is formed by the sputtering method for example. The sputtering method is performed under a pressure of 0.6 to 1.2 Pa and in an Ar gas atmosphere. The upper electrode 16 and the piezoelectric thin film 14 are shaped into a predetermined shape by the exposure technology, the etching technique and the like for example. The region in which the lower electrode 12, the piezoelectric thin film 14, the upper electrode 16 and the sacrifice layer 17 overlap is formed. The lower electrode 12 is exposed from the aperture formed in the piezoelectric thin film 14. The etching liquid is injected from the hole portion 15 and the introduction path 13 illustrated in FIG. 1A, and the sacrifice layer 17 is removed. The stress of the composite film composed of the lower electrode 12, the piezoelectric thin film 14 and the upper electrode 16 is a compression stress. Therefore, when the etching of the sacrifice layer 17 is completed, the composite film bulges out, and the space 18 having a dome shape on the composite film side is formed between the lower electrode 12 and the substrate 10. With above described processes, the FBAR in accordance with the first embodiment is formed.

The FBAR in accordance with the first embodiment includes the substrate 10, the lower electrode 12 located on the substrate 10, the piezoelectric thin film 14 located on the lower electrode 12, and the upper electrode 16 facing the lower electrode 12 across the piezoelectric thin film 14. The residual stress of the piezoelectric thin film 14 is a tensile stress. Thus, as illustrated in FIG. 3, the ratio of lattice constants c/a becomes smaller than its bulk value 1.6. As a result, the FBAR having a large piezoelectric constant $e_{33}$ and a large electromechanical coupling factor $k_{33}^2$ is formed.

To obtain a large electromechanical coupling factor $k_{33}^2$, the ratio of lattice constants c/a may be smaller than its bulk value 1.6, or the lattice constant c may be smaller than its bulk value 0.498 nm. In addition, c/a can be made to be smaller than 1.5, 1.4 or 1.3 for example. The lattice constant c can be made to be smaller than 0.495 nm, 0.49 nm or 0.485 nm. One of the ratio of lattice constants c/a and the lattice constant c may be made to be smaller than its bulk value, or both of them may be made to be smaller than respective bulk values. The ratio of lattice constants c/a may be equal to or smaller than 1.6. The lattice constant c may be equal to or smaller than 0.498 nm. Since the piezoelectric thin film 14 is made of additive-free AlN, it is not necessary to adjust the density of the additive (dopant) in the process for forming the piezoelectric thin film 14. Thus, the process is simplified, and the cost of the piezoelectric thin film resonator is reduced. In addition, as it is possible to suppress the variability of characteristics of the acoustic wave device caused by the non-uniformity of the density of the additive, it is possible to increase the yield ratio.

Figure 7A:
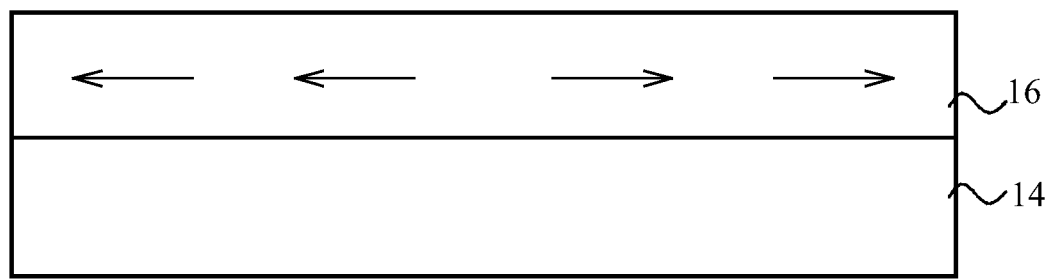
FIG. 7A is a schematic view illustrating an example of adjusting a residual stress of a piezoelectric thin film.

To make the residual stress of the piezoelectric thin film 14 a tensile stress, the residual stress of the upper electrode 16 may be used for example. FIG. 7A is a schematic view illustrating an example of adjusting the residual stress of the piezoelectric thin film. In the drawing, the piezoelectric thin film 14 and the upper electrode 16 of the piezoelectric thin film resonator are extracted, and the hatching is omitted. Arrows in the drawing represent a residual stress. To simplify the illustration, the piezoelectric thin film 14 and the upper electrode 16 are illustrated having almost the same thickness.

As illustrated in FIG. 7A, the residual stress of the upper electrode 16 is a tensile stress. The residual stress of the upper electrode 16 is applied to the piezoelectric thin film 14 by locating the upper electrode 16 on the piezoelectric thin film 14. As a result, the residual stress of the piezoelectric thin film 14 becomes a tensile stress. To adjust the residual stress more effectively, it is preferable that the piezoelectric thin film 14 contacts the upper electrode 16. The ratio of lattice constants c/a or the lattice constant c may be made to be smaller than its bulk value by using both the increase of the flow rate of Ar gas and the residual stress of the upper electrode 16. In addition, the residual stress may be adjusted by using an additional film. An embodiment using an additional film is a modified embodiment of the first embodiment.

Figure 7B:
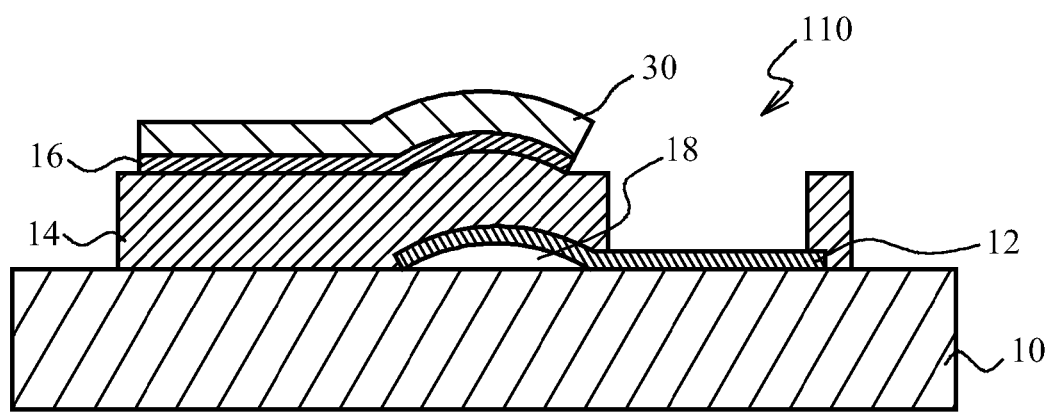
FIG. 7B is a cross-sectional view illustrating an FBAR in accordance with a modified embodiment of the first embodiment.

FIG. 7B is a cross-sectional view illustrating an FBAR in accordance with the modified embodiment of the first embodiment. A description of the same structures as those illustrated in FIG. 1B is omitted. An FBAR 110 in accordance with the modified embodiment of the first embodiment includes an additional film 30. The additional film 30 is located on the upper electrode 16. The additional film 30 may be made of an insulating material such as oxide silicon ($SiO_2$) and silicon nitride (SiN), or a metal. The residual stress of the piezoelectric thin film 14 can be made to be a tensile stress with the residual stress of the upper electrode 16 and the residual stress of the additional film 30.

The lower electrode 12 and the upper electrode 16 have a two-layer structure, but may have a single layer structure or a structure having more than three layers. As materials of the lower electrode 12 and the upper electrode 16, metals such as aluminum (Al), copper (Cu), chrome (Cr), molybdenum (Mo), tungsten (W), tantalum (Ta), platinum (Pt), ruthenium (Ru), rhodium (Rh) and iridium (Ir) may be used. The lower electrode 12 may be exposed to the space 18, but is not necessarily exposed.

Second Embodiment

A second embodiment is an example in which the piezoelectric thin film 14 is made of doped AlN. A structure of an FBAR in accordance with the second embodiment is the same as the one illustrated in FIG. 1A and FIG. 1B except the composition of AlN forming the piezoelectric thin film 14. The piezoelectric thin film 14 is made of doped AlN which is doped with the ternary element. The ternary element with which AlN is doped is Ti, Zr, Hf and the like. The ternary element content ratio of the doped AlN is 12.5 atomic % for example. The ternary element with which AlN is doped is disposed in an Al site of AlN. In other words, Al is replaced with the ternary element. The content ratio of the ternary element can be changed in accordance with the value of a target lattice constant.

A description will now be given of a fabrication method of the FBAR in accordance with the second embodiment. Cross-sectional views illustrated in FIG. 6A through FIG. 6C are also common to the second embodiment. In the sputtering method for forming the piezoelectric thin film 14, an Al target and a ternary element target such as Ti target are used. Accordingly, the piezoelectric thin film 14 made of the doped AlN is formed. In addition, it is possible to use a mixed-metal target wherein the Al target is preliminarily doped with Ti having a desired density.

The piezoelectric thin film 14 included in the FBAR in accordance with the second embodiment is made of AlN to which the ternary element is added. Thus, the ratio of lattice constants c/a becomes small, and the piezoelectric constant $e_{33}$ becomes large. As a result, the FBAR having a large electromechanical coupling factor $k_{33}^2$ is formed.

As the ternary element, a transition metal element may be used for example. As illustrated in FIG. 4 through FIG. 5B, to obtain a large electromechanical coupling factor $k_{33}^2$, it is preferable that the piezoelectric thin film 14 is doped with Ti, Zr, Hf or the like as the ternary element. In addition, the piezoelectric thin film 14 may be doped with two of or all of Ti, Zr and Hf. In other words, the piezoelectric thin film 14 is made of AlN to which at least one of Ti, Zr and Hf is added. It is sufficient if a large electromechanical coupling factor $k_{33}^2$ can be obtained by doping AlN with the ternary element. In addition, the first embodiment and the second embodiment may be combined. That is to say, it is possible that the residual stress of the piezoelectric thin film 14 is a tensile stress and the piezoelectric thin film 14 is made of doped AlN.

Although the FBAR was described as an example of the acoustic wave device, the first embodiment and the second embodiment can be applied to acoustic wave devices other than the FBAR. FIG. 8A through FIG. 9B are cross-sectional views illustrating other examples of the acoustic wave device. A description of the structure already described in FIG. 1A and FIG. 1B is omitted.

Figure 8A:
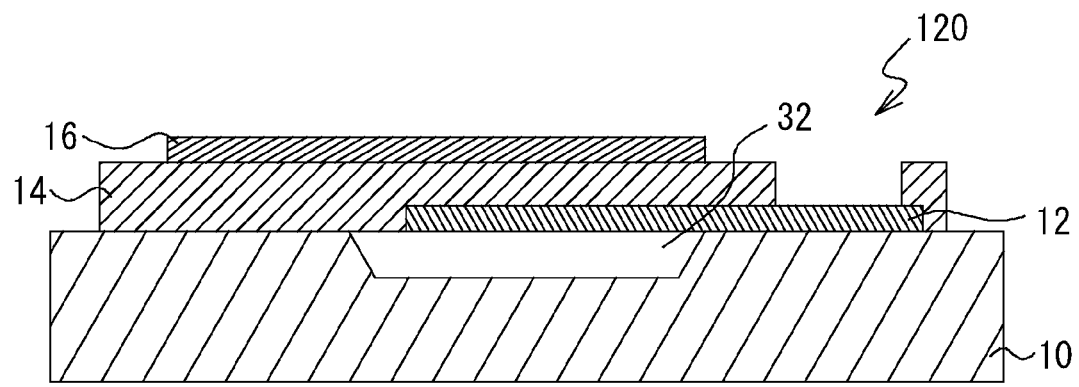
FIG. 8A and FIG. 8B are cross-sectional views illustrating another example of the acoustic wave device.

As illustrated in FIG. 8A, a space 32 is formed in the substrate 10 of an FBAR 120. The space 32 overlaps with the lower electrode 12, the piezoelectric thin film 14 and the upper electrode 16. The lower electrode 12 is exposed to the space 32. The space 32 is formed by removing a part of the substrate 10 by the etching technique or the like for example. The space 32 may pierce through the substrate 10 in the thickness direction.

Figure 8B:
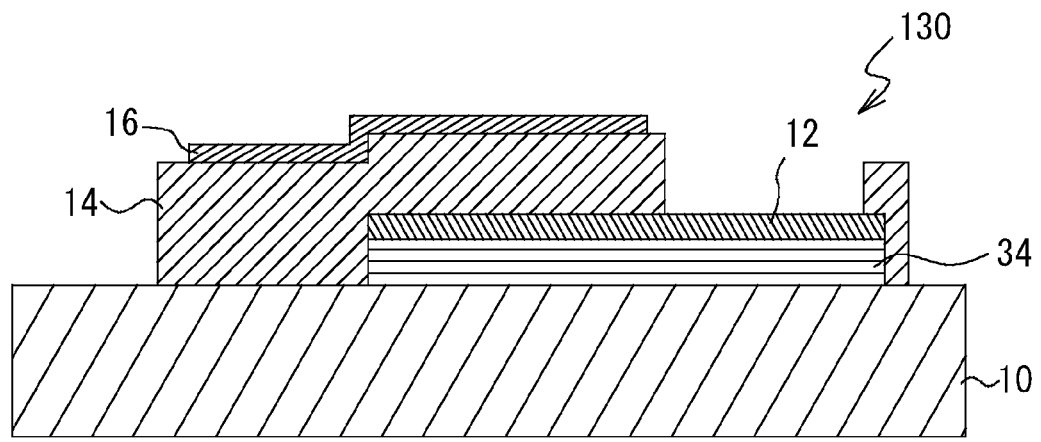

As illustrated in FIG. 8B, an SMR 130 includes an acoustic reflection film 34. The acoustic reflection film 34 is located between the substrate 10 and the lower electrode 12. The acoustic reflection film 34 is a stacked film of a film having a high acoustic impedance and a film having a low acoustic impedance.

Figure 9A:
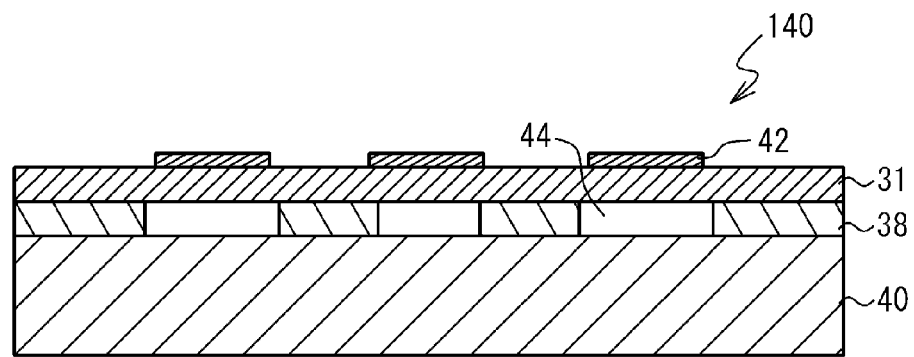
FIG. 9A and FIG. 9B are cross-sectional views illustrating another example of the acoustic wave device.

As illustrated in FIG. 9A, an acoustic wave resonator 140 includes a piezoelectric film 31, a first support substrate 38, a second support substrate 40, and an electrode 42. The bottom surface of the first support substrate 38 is bonded to the second support substrate 40 by the surface activated bonding, the resin bonding or the like for example. The piezoelectric film 31 is located in the upper surface of the first support substrate 38. A hole portion which pierces through the first support substrate 38 in the thickness direction is formed in the first support substrate 38. The hole portion functions as a space 44 between the piezoelectric film 31 and the second support substrate 40. The electrode 42 is located in a region which overlaps with the space 44 located in the upper surface of the piezoelectric film 31. The piezoelectric film 31 may be made of AlN of which c/a is smaller than 1.6, or may be made of AlN of which the lattice constant c is smaller than 0.498 nm. The acoustic wave resonator 140 is a resonator using a Lamb wave.

Figure 9B:
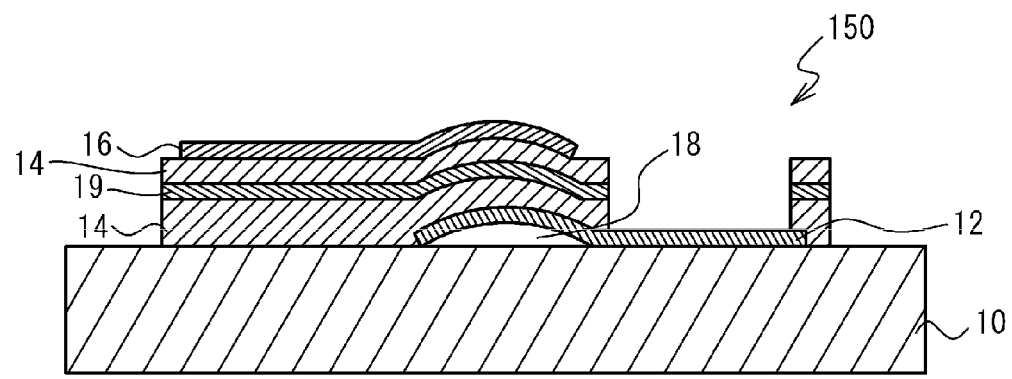

As illustrated in FIG. 9B, an FBAR 150 includes a temperature compensation film 19. The temperature compensation film 19 is inserted into the piezoelectric thin film 14, and contacts the piezoelectric thin film 14. The temperature compensation film 19 is made of $SiO_2$ or doped $SiO_2$ which is doped with fluorine (F) or the like. In other words, the temperature compensation film 19 includes $SiO_2$. The temperature coefficient of the elastic constant of the temperature compensation film 19 is opposite in sign to that of the piezoelectric thin film 14. Thus, temperature characteristics of the FBAR 150 become stable. The acoustic wave device illustrated in FIG. 8A through FIG. 9A may include the temperature compensation film 19. The first embodiment or the second embodiment can be applied to a filter and duplexer including a resonator, and an acoustic wave device such as a module including a filter, a duplexer and the like.

Although the embodiments of the present invention have been described in detail, it should be understood that the various change, substitutions, and alterations could be made hereto without departing from the spirit and scope of the invention.

What is claimed is:

1. An acoustic wave device, comprising:
   a substrate;
   a lower electrode that is located on the substrate;
   a piezoelectric film that is located on the lower electrode and made of aluminum nitride of which a ratio of a lattice constant in a c-axis direction to a lattice constant in an a-axis direction is smaller than 1.6; and
   an upper electrode that is located on the piezoelectric film and faces the lower electrode across the piezoelectric film,
   wherein the piezoelectric film is made of aluminum nitride to which at least one of titanium, zirconium and hafnium is added.

2. The acoustic wave device according to claim 1, wherein a temperature compensation film is inserted into the piezoelectric film.

3. The acoustic wave device according to claim 2, wherein the temperature compensation film includes silicon oxide.

4. An acoustic wave device, comprising:
   a substrate;
   a lower electrode that is located on the substrate;
   a piezoelectric film that is located on the lower electrode and made of aluminum nitride of which a lattice constant in a c-axis direction is smaller than 0.498 nm; and
   an upper electrode that is located on the piezoelectric film and faces the lower electrode across the piezoelectric film,
   wherein the piezoelectric film is made of aluminum nitride to which at least one of titanium, zirconium and hafnium is added.

5. The acoustic wave device according to claim 4, wherein a temperature compensation film is inserted into the piezoelectric film.

6. The acoustic wave device according to claim 5, wherein the temperature compensation film includes silicon oxide.

* * * * *